(12) United States Patent
Gibbert et al.

(10) Patent No.: US 12,298,333 B2
(45) Date of Patent: May 13, 2025

(54) SOLUTIONLESS SENSOR CALIBRATION (71) Applicant: Parker-Hannifin Corporation, Cleveland, OH (US)

(72) Inventors: Charlene N. Gibbert, Camarillo, CA (US); Marcos Delmar, Simi Valley, CA (US); Dean Pighin, Newbury Park, CA (US)

(73) Assignee: Parker-Hannifin Corporation, Cleveland, OH (US)

( * ) Notice: Subject to any disclaimer, the term of this patent is extended or adjusted under 35 U.S.C. 154(b) by 239 days.

(21) Appl. No.: 18/066,147

(22) Filed: Dec. 14, 2022

(65) Prior Publication Data
US 2023/0123201 A1 Apr. 20, 2023

Related U.S. Application Data (63) Continuation of application No. PCT/US2021/038346, filed on Jun. 22, 2021.
(Continued)

(51) Int. Cl.
*G01R 27/22* (2006.01)
*G01D 21/02* (2006.01)
*G01R 35/00* (2006.01)

(52) U.S. Cl.
CPC ............. *G01R 27/22* (2013.01); *G01D 21/02* (2013.01); *G01R 35/005* (2013.01)

(58) Field of Classification Search
CPC ...... G01R 27/22; G01R 35/005; G01R 35/00; G01D 21/02; G01N 27/07; G01N 27/046; G01N 27/4163
(Continued)

(56) References Cited

U.S. PATENT DOCUMENTS 5,341,102 A 8/1994 Akiyama et al.
5,708,363 A 1/1998 Yates et al.
(Continued)

FOREIGN PATENT DOCUMENTS

DE 102012106551 A1 1/2014
DE 102014001354 A1 8/2014
(Continued)

OTHER PUBLICATIONS

Emerson Process Management; Calibrating Contacting Conductivity Sensors; http://www.raihome.com; Jul. 2010; 4 pages.
(Continued)

*Primary Examiner* — Giovanni Astacio-Oquendo
(74) *Attorney, Agent, or Firm* — Reinhart Boerner Van Deuren P.C.

(57) ABSTRACT

A calibration device for a conductivity sensor for aqueous solutions. The calibration device includes a first connector configured to electrically couple with the sensor electrodes of the conductivity sensor. The connector is further configured to provide for the application of a controlled voltage across at least two of the sensor electrodes. A first resistor is connected between the at least two sensor electrodes and coupled to the first connector. The resistor has a value such that a current flow between the at least two sensor electrodes replicates the properties of an electrochemical calibration solution. In certain embodiments, the calibration device is configured for pH sensors or dissolved oxygen sensors.

24 Claims, 5 Drawing Sheets

Related U.S. Application Data (60) Provisional application No. 62/705,310, filed on Jun. 22, 2020.

(58) Field of Classification Search
USPC .......................................... 324/445, 439, 425
See application file for complete search history.

(56) References Cited

U.S. PATENT DOCUMENTS

| | | | | |
|---|---|---|---|---|
| 7,857,506 B2* | 12/2010 | Schick | ................... | G01N 27/10 |
| | | | | 324/705 |
| 8,513,956 B2* | 8/2013 | Bevilacqua, Jr. | ...... | G01N 27/06 |
| | | | | 324/439 |
| 8,525,533 B2 | 9/2013 | Sullivan | | |
| 10,101,290 B2* | 10/2018 | Paul | ....................... | G01R 27/28 |
| 11,733,278 B2* | 8/2023 | Salkie | ................... | G01N 27/06 |
| | | | | 324/724 |
| 2005/0127919 A1* | 6/2005 | Feng | ....................... | G01N 27/07 |
| | | | | 324/439 |
| 2005/0189936 A1* | 9/2005 | Quackenbush | ........ | G01D 18/00 |
| | | | | 324/750.02 |
| 2007/0024287 A1 | 2/2007 | Graves et al. | | |

FOREIGN PATENT DOCUMENTS

| | | |
|---|---|---|
| EP | 2413133 A2 | 2/2012 |
| JP | S6285852 A | 4/1987 |
| JP | 2005114575 A | 4/2005 |
| KR | 101519356 B1 | 5/2015 |
| RO | 127440 A2 | 5/2012 |

OTHER PUBLICATIONS

"SciConTM Conductivity Monitor & Sensor Operators Manual—Conductivity Monitoring with Disposable Sensors", Parker Hannifin Corporation, 2018, Search date: Jan. 27, 2025, Internet, URL: https://aldax.se/wp-content/uploads/2018/08/SciLog_SciCon_2018-Manual.pdf, pp. 1, 8, 10, 14, 20 and 28-33.

\* cited by examiner

SOLUTIONLESS SENSOR CALIBRATION

CROSS-REFERENCE TO RELATED PATENT APPLICATIONS

This patent application is a continuation of U.S. PCT Patent Application No. PCT/US2021/038346, filed Jun. 22, 2021, which claims the benefit of U.S. Provisional Patent Application No. 62/705,310, filed Jun. 22, 2020, the entire teachings and disclosure of which are incorporated herein by reference thereto.

FIELD OF THE INVENTION

The present invention generally relates to a system and method for the calibration of conductivity sensors for aqueous solutions, or any electrochemical sensor technology that sense a change in potential (voltage) or loss/gain of electrons to translate to the measurement of conductivity, pH, dissolved oxygen (DO), or other applicable responses.

BACKGROUND OF THE INVENTION

Conductivity, in aqueous solutions, is a measure of the ability of water to conduct an electric current. The more ions there are in the solution, the higher its conductivity. Temperature also impacts the conductivity. As the temperature of the solution increases, there is a corresponding increase in the solubility of the material being dissolved in the solution, and a resulting increase in the conductivity.

For electricity to flow, there needs to be a movement of charged particles (e.g., ions). With solid NaCl or KCl crystals, there is no flow of electricity—although the solid is made up of ions, they are held together very tightly within the crystal lattice and therefore no current will flow. However, in aqueous solutions, these ions are mobile allowing for a flow of electricity.

Conventional manufacturing processes for aqueous-solution conductivity sensors require a conductivity solution to be within a predetermined allowable conductivity and temperature range in order to calibrate the sensor. There are several challenges related to ensuring that these requirements are met during sensor calibration. For example, the conductivity of the conductivity solution may be highly variable and, in some instances, has been observed to fluctuate after it is refreshed between sets. Additionally, a relatively constant solution temperature during calibration can be difficult to maintain without fluctuations (i.e., from adjusting the water bath temperature).

Additionally, successfully calibrating the sensor may be dependent on the accuracy of third-party conductivity and temperature probes for reference. Routine external calibration of third-party probes is required to maintain specification. However in many instances, third party probes do not agree with one another for temperature or conductivity readings when compared to each other.

In many conventional calibration setups, Temperature loss occurs in-line with the sensor chain, which can be difficult to control. Typically, the conductivity solution must be unused and NIST-certified. Following calibration, the sensors much be cleaned thoroughly increasing the cost and manufacturing time for conventional conductivity sensors. Further, there is a necessary stability time for the sensor body and conductivity solution to reach the required temperature. This may require an operator to constantly monitor the sensor and solution temperatures.

As a result of the aforementioned issues, in some cases, the calibration pass rate for newly manufactured conductivity sensors can be as low as 25-30% on first attempt at calibration.

Embodiments of the present invention relate to a system and method for calibration conductivity sensors for aqueous solutions that address many of the problems described above. These and other advantages of the invention, as well as additional inventive features, will be apparent from the description of the invention provided herein.

BRIEF SUMMARY OF THE INVENTION

In one aspect, embodiments of the invention provide a calibration device for a conductivity sensor for aqueous solutions. The calibration device includes a first connector configured to electrically couple with the sensor electrodes of the conductivity sensor. The connector is further configured to provide for the application of a controlled voltage across at least two of the sensor electrodes. A first resistor is connected between the at least two sensor electrodes and coupled to the first connector. The resistor has a value such that a current flow between the at least two sensor electrodes replicates the properties of an electrochemical calibration solution.

In a particular embodiment, the calibration device has a second connector connected to the resistor, and also connected to a conductivity monitor. In certain embodiments, the first connector is configured to electrically couple with at least four sensor electrodes of the conductivity sensor, and the calibration device further includes a resistor network with the first resistor, a second resistor, and a third resistor, wherein each of the three resistors is coupled between a different two of the four sensor electrodes. In a particular embodiment, the first resistor has a resistance value of 40.2 ohms, and the second and third resistors each have a resistance value of 221 ohms.

In another embodiment of the invention, the first resistor has a resistance value that ranges from 38 to 42 ohms. In a more particular embodiment, the first resistor has a resistance value of 40.2 ohms. The calibration device may further include a temperature calibration circuit configured to simulate a 25-degree-Celsius environment for the conductivity sensor being calibrated. In some embodiments, the temperature calibration circuit includes a switching element coupled to a pair of resistors. In particular embodiments, one of the pair of resistors has a resistance value of between 200 and 300 ohms, and a second of the pair of resistors has a resistance value of between 1.5 and 2.5 kilo-ohms. In more particular embodiments, one of the pair of resistors has a resistance value of 226 ohms, and a second of the pair of resistors has a resistance value of 2.1 kilo-ohms. The calibration device may further include a terminal configured for connection to an external power source.

In another aspect, embodiments of the invention provide a method for calibrating a conductivity sensor for aqueous solutions. The method includes the steps of applying a voltage across two electrodes of the conductivity sensor to replicate the properties of an electrochemical calibration solution, measuring an electrical current flowing between the two electrodes, and determining whether the conductivity sensor is successfully calibrated based on whether the measured current falls within a predetermined range.

In some embodiments, the method further includes connecting a resistor between the two electrodes. The method may also include providing a resistor network that connects at least one resistor to each of a plurality of electrodes of the conductivity sensor. Further embodiments of the method call for simulating a 25-degree-Celsius environment for the conductivity sensor being calibrated.

A particular embodiment of the method includes connecting a calibration device to a plurality of electrodes of the conductivity sensor. The calibration device includes one or more resistors coupled to each of the plurality of electrodes. Furthermore, the method may call for connecting a calibration device with a temperature calibration circuit for simulating a 25-degree-Celsius environment for the conductivity sensor being calibrated.

In yet another aspect, embodiments of the invention provide a method for calibrating a conductivity sensor. The method includes the steps of applying a controlled voltage across two electrodes of the sensor, sensing a current across the two electrodes while maintaining the sensor at a controlled temperature, and calculating the conductivity of the sensor, based on whether the sensed current falls within a predetermined range indicating a pass of the sensor. Embodiments of this method include the step of applying a constant voltage from an external power source.

Particular embodiments of the invention include a calibration device, for a conductivity sensor for aqueous solutions, that applies external controlled voltage across two sensor electrodes or, in an alternate embodiment, supplies current between two sensor electrodes, which have a set series of resistors and/or capacitors to replicate the properties of an electrochemical calibration solution, thereby eliminating the need for direct solution contact with the sensor electrodes during the calibration process.

Other aspects, objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

In particular embodiments, the present invention includes a conductivity sensor for aqueous solutions, in which an external controlled voltage is applied across two of a plurality of sensor electrodes to facilitate a solutionless calibration process. In embodiments of the invention, the external controlled voltage is a constant voltage, which may be provided by an external power source. In alternate embodiments, a current may be supplied between these two electrodes. The aforementioned sensor electrodes may have a set series of resistors and/or capacitors to replicate the properties of an electrochemical calibration solution, thereby eliminating the need for direct contact between the sensor electrodes and the electrochemical calibration solution during the calibration process.

While the embodiments of the invention described herein relates to conductivity sensors, those of ordinary skill in the art will recognize that the technology and scope of the invention may be just as applicable to the measurement of pH and/or dissolved oxygen, or any other application that involves sense a change in potential (voltage) or loss/gain of electrons.

The relationship between the current and voltage at specific nominal conductivities may generally be characterized in the manner shown below. Sensor resistance is related to the conductivity reading as follows:

Conductivity=(Ic−Im)/V;

wherein Ic is the raw current from Analog to Digital Converter (ADC);

Im is the Zero Level of Excitation Current; and

V is the raw voltage from Analog to Digital Converter (ADC).

As used herein, "zero level of excitation current" refers to the small amount of current that flows in the primary winding of a transformer when a normal voltage is applied to the primary winding terminals when the terminals of the secondary windings are open-circuited. This current is called a transformer excitation current and flows all of the time during the operation of the transformer. The excitation current is required to sustain a magnetic field inside the core of the transformer, and is largely independent of the load on the secondary windings.

In a particular example of the conventional calibration of conductivity sensors, a one-point calibration may be performed using a 12.88-millisiemen (mS) conductivity solution in production. In this instance, when the voltage is 33,872±1,069 volts and current is 394,871±53,662 milliamperes, the conductivity is read as 12,880 microsiemens (µS) or 12.88 millisiemens (mS). Current levels, sensed and measured by the conductivity monitor, should be within the range of 394,871±53,662 milliamperes when the voltage is applied to indicate a successfully calibrated sensor.

Voltage is controlled w.r.t. 12880 µS (from table).

Conductivity is nominal: 12880 µS.

$$12880 \; uS = \left(\frac{I_C - I_M}{33872 \; V}\right) * 1000$$

$$\text{Conductivity} = \left(\frac{I_C - I_M}{V}\right) * 1000$$

$$I_C - I_M = 436.271 \; A$$

A higher-than-expected current value is an indication that there may be problems with the calibration equipment or conductivity sensor that require additional inspection.

With respect to the present invention, the conductivity calibration process was designed as a substitute for calibration using a solution with a known conductivity of 12.88 millisiemens (mS) at 25 degrees Celsius. However, as indicated above, versions of this process could be used as a substitute for conventional calibration processes for pH sensors or DO sensors. To accomplish this with respect to conductivity, the claimed system acts to simulate the properties of the solution of known conductivity. The claimed system and method allow for a more controlled and repeatable calibration setup process (in ambient room temperature) as oppose to the existing calibration setup process which requires the use of a known 12.88 mS fluid in a temperature-controlled chamber at 25 degrees Celsius.

Figure 1:
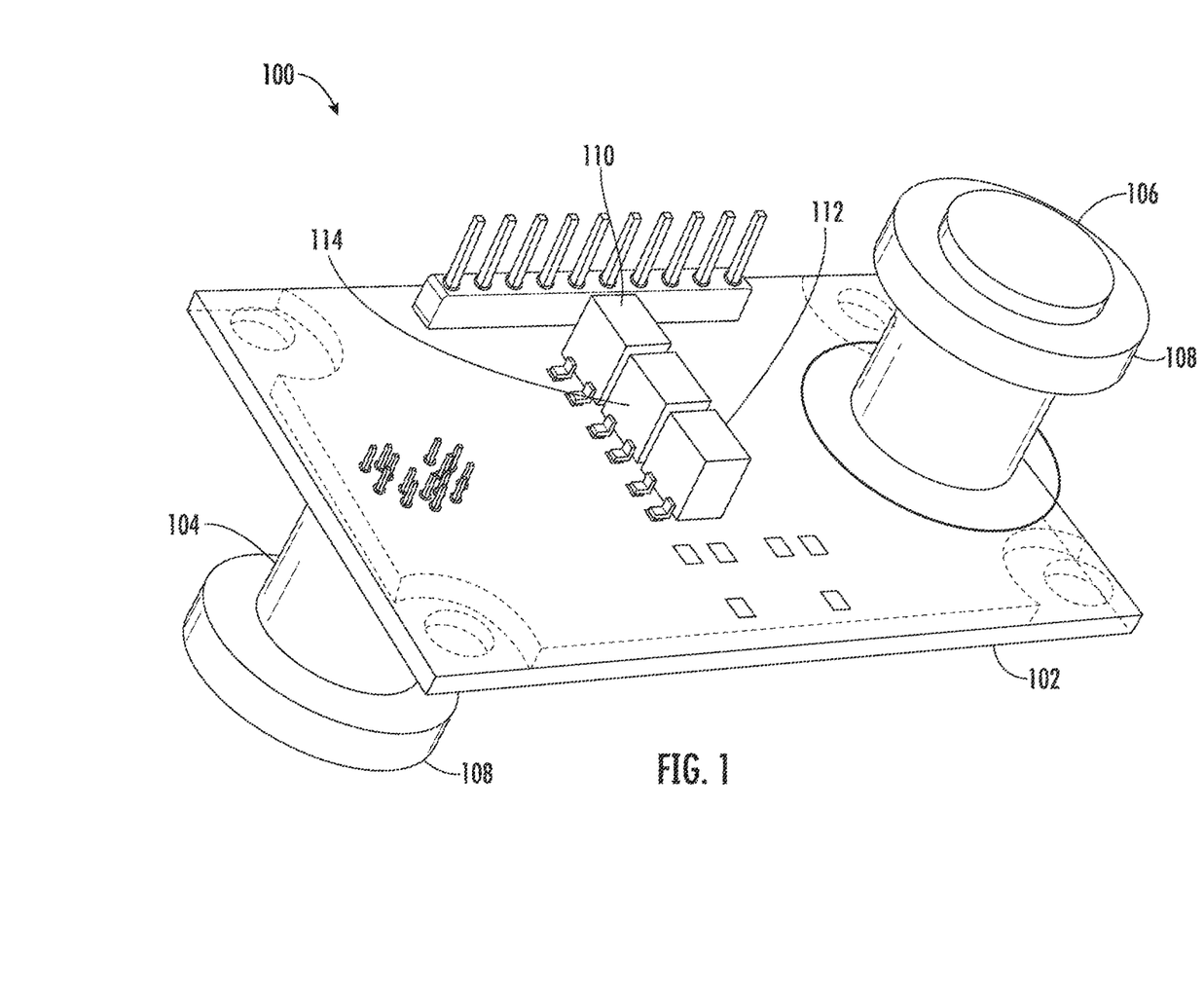
FIG. 1 is a perspective view of the calibration device in accordance with an embodiment of the invention.

FIG. 1 is a perspective view of the calibration device 100. As shown in FIG. 1, the calibration device 100 does not include a housing, though it is envisioned that commercial embodiments of the device 100 will be disposed within a housing. The embodiment of the calibration device 100 shown in FIG. 1 includes a circuit board 102 that configured for connection to the conductivity sensor on one side of the circuit board 102, and to the conductivity monitor (not shown) on a second side of the circuit board 102 opposite the first side. However, it is envisioned that alternate embodiments of the invention may allow for connection of the sensor and monitor on the same side of the circuit board 102. In alternate embodiments of the invention, the circuit board 102 is configured for connection to a pH sensor, DO sensor, etc.

The calibration device 100 achieves this goal by leveraging two sub-circuits. One passive sub-circuit for conductivity and one active sub-circuit for temperature compensation. The passive conductivity sub-circuit consists of a resistance network, which will be described in more detail below, equivalent to a conductivity of 12.88 mS. During the calibration process, the resistance network is connected to the conductivity sensor's electrode signal lines. This creates a conductivity feedback response equivalent to 12.88 mS back to the conductivity monitor.

In a particular embodiment, the conductivity sensor is connected to the circuit board 102 at a first connector 104, while the conductivity monitor is connected to the circuit board 102 at a second connector 106. While the conductivity monitor is not shown, those of ordinary skill in the art will recognize that the conductivity monitor is used to detect, through its connection to the second connector 106, the current flowing between the electrodes of the sensor thus allowing for a determination as to the successful calibration of the conductivity sensor. The conductivity sensor also controls the voltage applied to the conductivity sensor electrodes, and initiates operation of a temperature calibration circuit to be described below.

In FIG. 1, the first and second connectors 104, 106 are covered by caps 108 to protect the connector terminals when not in use. The calibration device 100 includes a resistor network with three resistors: R1 110, R3 112, and R5 114 that are connected between the conductivity monitor and the conductivity sensor. In a specific embodiment of the invention, the resistance value of R1 is 221 ohms, the resistance value of R3 is 40.2 ohms, and the resistance value of R5 is 221 ohms.

Figure 2:
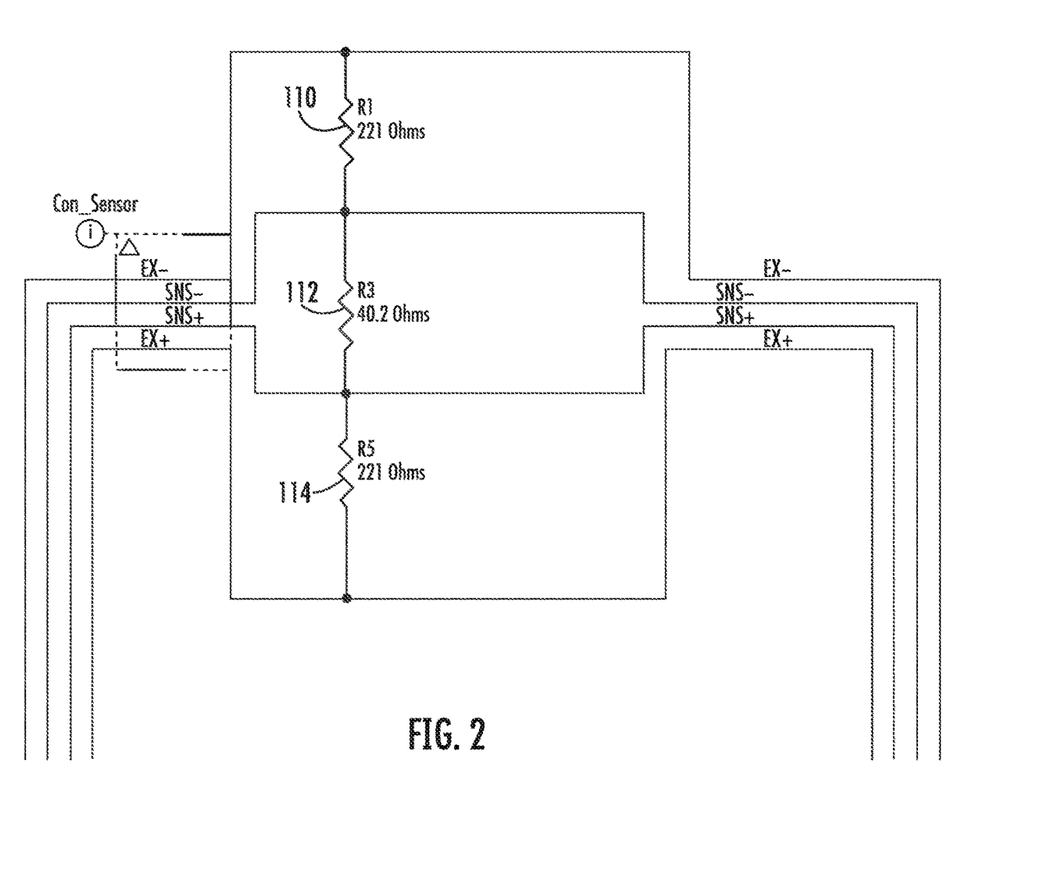
FIG. 2 is a schematic diagram showing a resistor network used in the calibration device of FIG. 1, in accordance with an embodiment of the invention.
Figure 3:
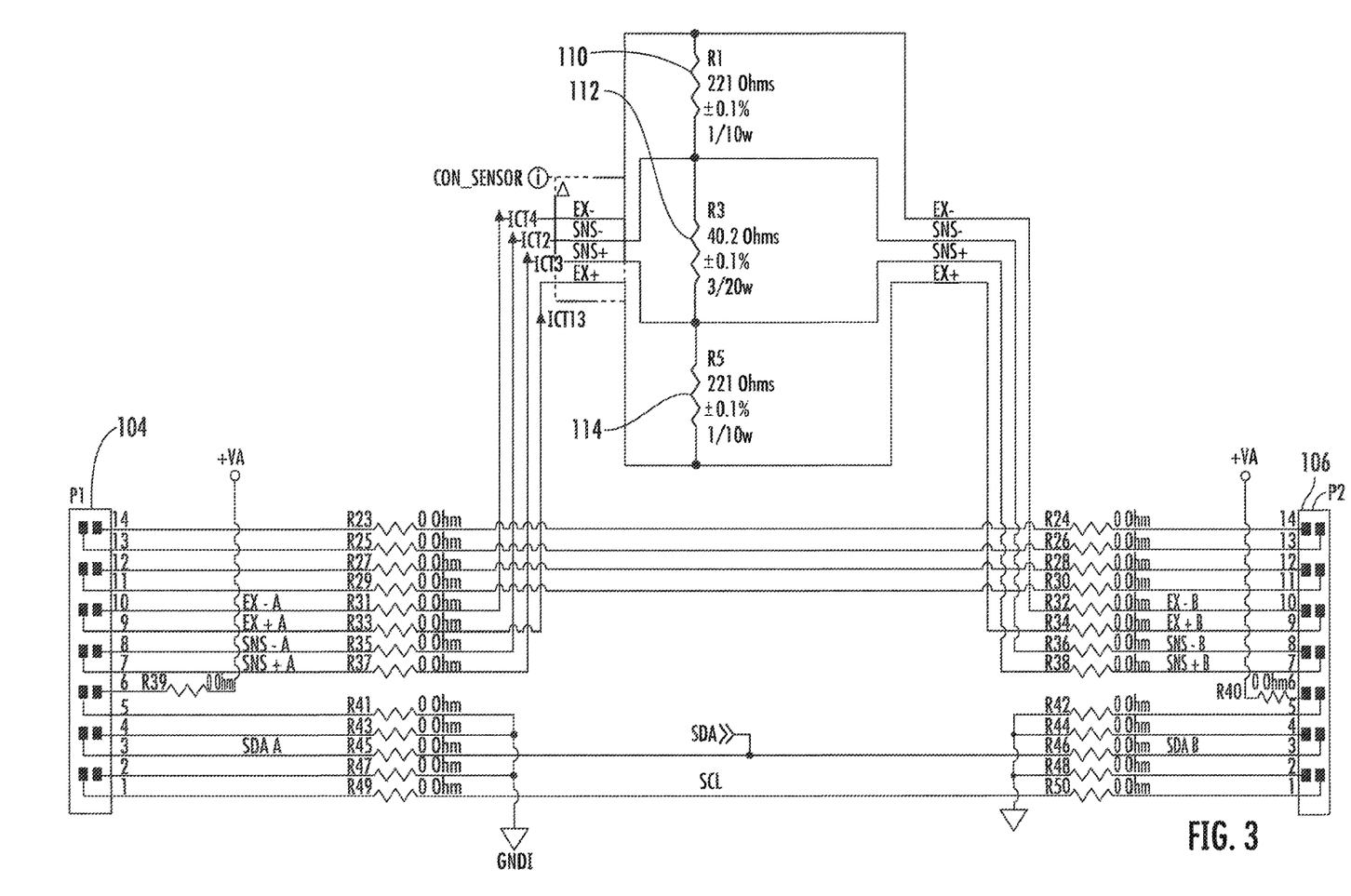
FIG. 3 is a schematic diagram showing how the resistor network is coupled to first and second connectors, in accordance with an embodiment of the invention.

FIGS. 2 and 3 are schematic diagrams of the circuitry used in the calibration device 100, in accordance with an embodiment of the invention. FIGS. 2 and 3 show the aforementioned resistor network with three resistors R1 110, R3 112, and R5 114. As shown in FIG. 3, the three resistors R1 110, R3 112, and R5 114 are coupled to the first connector 104, which is connected to the conductivity sensor, and also coupled to the second connector 106, which is connected to the conductivity monitor.

The resistor network, arranged as shown in FIGS. 2 and 3, helps form the claimed conductivity calibration system and method which, in this embodiment, simulates a 12.88 mS fluid with those specific resistors placed across the excitation (EX +/−) and sensing (SN +/−) EX+,SN+,SN−, & EX− signal lines. In a particular embodiment, each of these four signal lines is connected to a sensor electrode 120 of the conductivity sensor 118 (see FIG. 5). FIGS. 2 and 3 show how the three resistors R1 110, R3 112, and R5 114 are implemented across the signal lines. Resistor R1 110, with an exemplary value of 221 ohms is connected between EX−& SNS−. Resistor R3 112 with an exemplary value of 40.2 ohms is connected between SNS−& SNS+. Resistor R5 114, with an exemplary value of 221 ohms is connected between SNS+& EX−.

Because conductivity is dependent on temperature, one of the requirements for successful calibration of the conductivity sensor relates to the temperature stability of the sensor body. Ideally, the conductivity sensors would be stored at 25 degrees Celsius inside of a temperature-controlled system for an extended period of time at which they are all observed to be temperature-stable (e.g., when a heat camera shows temperature uniformity).

Figure 4:
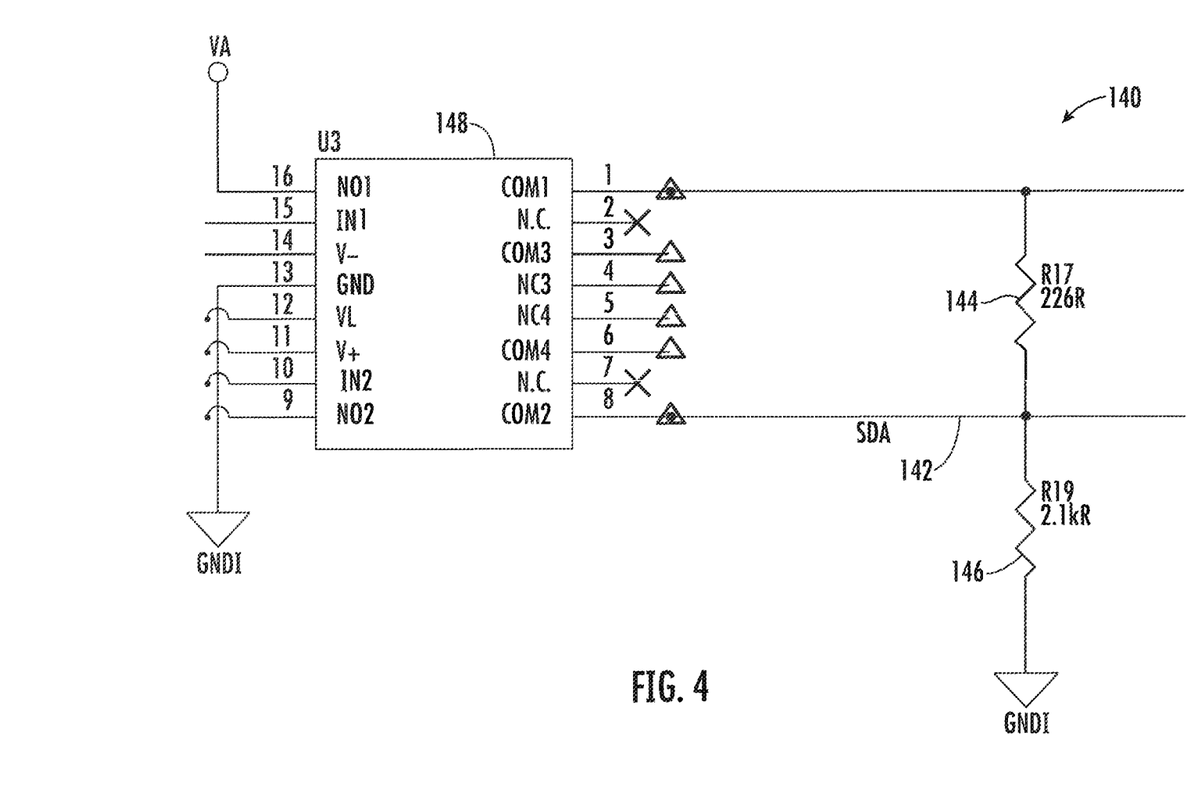
FIG. 4 is a schematic diagram of the temperature calibration circuit used in the calibration device of FIG. 1, in accordance with an embodiment of the invention.

FIG. 4 is a schematic diagram of the temperature calibration circuit 140 used in the calibration device 100, in accordance with an embodiment of the invention. The temperature calibration circuit 140 simulates a 25-degree-Celsius environment by applying a temperature resistor network to the serial data line (SDA) signal line 142 during calibration. In a particular embodiment of the invention, the resistor network includes two resistors: R17 144, and R19 146. In a specific embodiment, R17 144 has a resistance value of 226 ohms, and R19 146 has a resistance value of 2.1 kilo-ohms. A switch component U3 148, shown in FIG. 4, is triggered by the conductivity monitor (see U3 pins 15 & 10) during calibration to apply the temperature calibration circuit 140. The temperature calibration circuit 140 targets 25 degrees Celsius to effectively "trick" the sensor to believe it is at 25 degrees Celsius during calibration.

In specific embodiments, during the calibration process, the active sub-circuit, or temperature calibration circuit 140, applies a firmware controlled voltage bias to the temperature calibration circuit 140 of the conductivity sensor under test. This forces the temperature calibration circuit 140 of the conductivity sensor under test to respond with a voltage equivalent to 25 degrees Celsius most commonly associated with an ambient room temperature. In a particular embodiment, the voltage bias signal is delivered via the second connector 106, the voltage being controlled by firmware within the conductivity monitor. This allows for precision timing for applying temperature compensation during sensor calibration and for removing temperature compensation before writing calibration offset values to the conductivity sensor's non-volatile memory.

In testing, the temperature calibration method described above using the temperature calibration circuit 140 proved effective as units calibrated using this method were found to have an equal or better standard deviation percentage than conventionally-calibrated conductivity sensors. Once calibrated, each of the conductivity sensors is given a unique Calibration Factor (CF) and Temperature Offset (TO) value that are applied to the reading output (conductivity reading). The operator then observes the expected CF and TO values as indications of whether to categorize the conductivity sensor as PASS or FAIL after the calibration. Those that fail are typically separated and inspected for defects to determine their final disposition.

Figure 5:
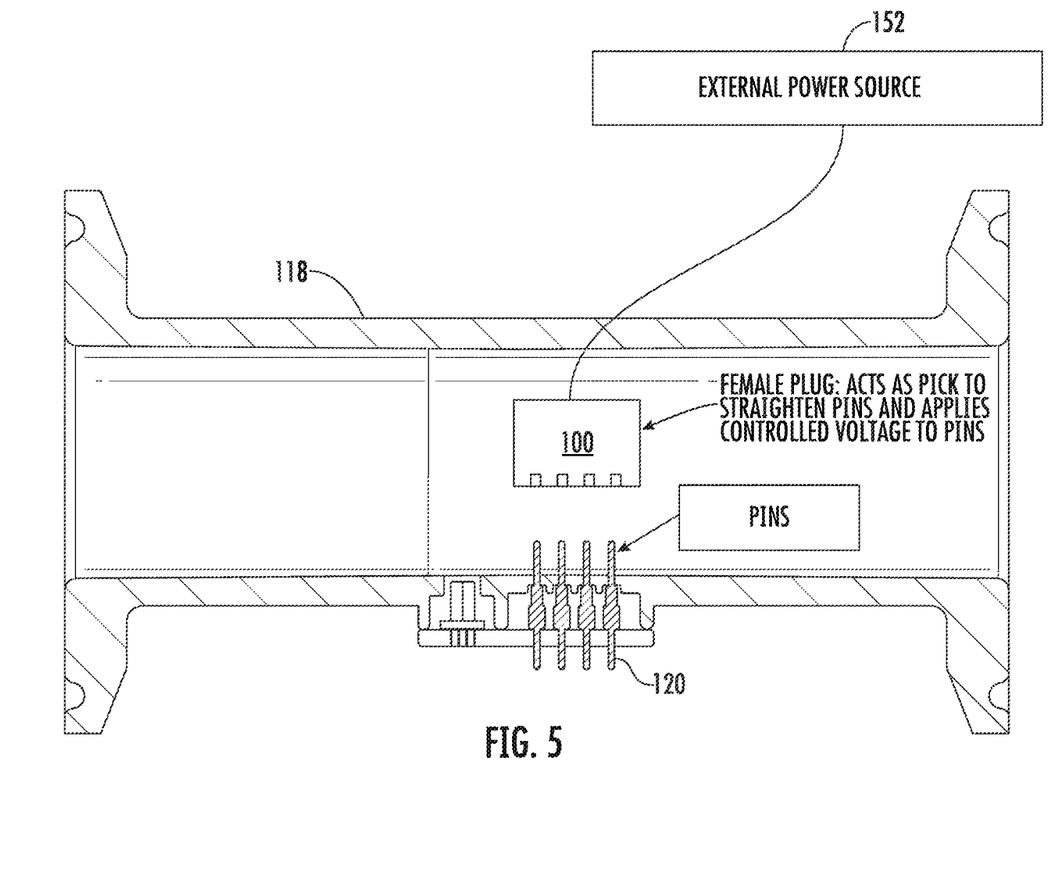
FIG. 5 is a schematic illustration of the calibration device as used in a conductivity sensor in accordance with an embodiment of the invention.

FIG. 5 is a schematic illustration of the calibration device 100 as used in a conductivity sensor 118 in accordance with an embodiment of the invention. A schematic representation of the calibration device 100 is illustrated in which the calibration device 100 connects to four electrodes 120 of the conductivity sensor 118. Alternate embodiments of the calibration device 100 may have fewer or greater than four electrodes 120. In the embodiment of FIG. 5, the calibration device 100 is supplied with power from an external power source 152, though it is envisioned that alternate embodiments of the calibration device 100 are battery-powered, for example.

As indicated in FIG. 5, the connector portion of the calibration device 100 is configured to apply a controlled voltage to at least two of the four electrodes 120 of the conductivity sensor 118. This connector portion may also provide the additional function of straightening the four sensor electrodes 120. This may be a useful function as electrode spacing (i.e., diameter, height, and distance) is important in conductivity sensors 118. If the electrodes 120 are too close, current will arc between the electrodes 120 and cause errors in readings. If the electrodes 120 a spaced too far apart, the current will not be able to carry as effectively between electrodes 120 and will cause errors in readings.

In testing, the conductivity calibration method was proven effective. Conductivity sensors 118 calibrated in accordance with the solutionless method described herein reported conductivity values generally in line with the conventionally-calibrated sensors. Overall, the testing confirmed that conductivity sensors 118 performed as well or better than the conventionally-calibrated conductivity sensors.

Therefore, as explained above, by applying an external controlled voltage to at least two of a plurality of sensor electrodes 120 of a conductivity sensor 118 (with a set resistor), the solutionless calibration device 100 replicates the current carried by a conductivity solution—thus eliminating the need for an actual solution when calibrating the conductivity sensors 118. The current can then be measured by the conductivity monitor to determine whether the sensor 118 falls within a predetermined range of acceptable values.

Additionally, it can be seen that the claimed calibration device 100 provides certain other advantages with respect to the manufacture and calibration of conductivity sensors 118 for aqueous solutions. As explained above, in alternate embodiments of the invention, these advantages may also be realized with respect to the manufacture and calibration of pH sensors or DO sensors. Specifically, the claimed system and method reduces the cost of calibration, improves the lead time to customers, increases yield, and reduces the risk of contaminating the product from calibration process. Further, the calibration device 100 improves the accuracy and tolerance of sensor specifications through more consistent calibration.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A calibration device for a conductivity sensor for aqueous solutions, the calibration device comprising:
    a first connector configured to electrically couple with the sensor electrodes of the conductivity sensor, the connector further configured to provide for the application of a controlled voltage across at least two of the sensor electrodes;
    a first resistor connected between the at least two sensor electrodes and coupled to the first connector, the first resistor having a value such that a current flow between the at least two sensor electrodes replicates the properties of an electrochemical calibration solution; and
    a temperature calibration circuit configured to simulate a 25-degree-Celsius environment for the conductivity sensor being calibrated.

2. The calibration device of claim 1, further comprising a second connector connected to the first resistor, and also connected to a conductivity monitor.

3. The calibration device of claim 1, wherein the first connector is configured to electrically couple with at least four sensor electrodes of the conductivity sensor, the calibration device further comprising a resistor network with the first resistor, a second resistor, and a third resistor, wherein each of the three resistors is coupled between a different two of the four sensor electrodes.

4. The calibration device of claim 3, wherein the temperature calibration circuit and the first resistor network are disposed on the same circuit board.

5. The calibration device of claim 1, wherein the first resistor has a resistance value of 40.2 ohms, and the second and third resistors each have a resistance value of 221 ohms.

6. The calibration device of claim 1, wherein the first resistor has a resistance value that ranges from 38 to 42 ohms.

7. The calibration device of claim 6, wherein the first resistor has a resistance value of 40.2 ohms.

8. The calibration device of claim 1, wherein the temperature calibration circuit includes a switching element coupled to a pair of resistors.

9. The calibration device of claim 8, wherein one of the pair of resistors has a resistance value of between 200 and 300 ohms, and a second of the pair of resistors has a resistance value of between 1.5 and 2.5 kilo-ohms.

10. The calibration device of claim 8, wherein one of the pair of resistors has a resistance value of 226 ohms, and a second of the pair of resistors has a resistance value of 2.1 kilo-ohms.

11. The calibration device of claim 1, further including a terminal configured for connection to an external power source.

12. The calibration device of claim 1, wherein the temperature calibration circuit and the first resistor are disposed on the same circuit board.

13. The calibration device of claim 1, wherein the temperature calibration circuit includes a switch component coupled to a network of two or more resistors.

14. The calibration device of claim 1, wherein the temperature calibration circuit is configured to simulate the 25-degree-Celsius environment during calibration by applying a temperature resistor network to a serial data line connected to a conductivity monitor.

15. A method for calibrating a conductivity sensor for aqueous solutions, comprising the steps of:
applying a voltage across two electrodes of the conductivity sensor to replicate the properties of an electrochemical calibration solution;
measuring an electrical current flowing between the two electrodes; and
determining whether the conductivity sensor is successfully calibrated based on whether the measured current falls within a predetermined range.

16. The method of claim 15, wherein applying a voltage across two electrodes of the conductivity sensor to replicate the properties of an electrochemical calibration solution comprises connecting a resistor between the two electrodes.

17. The method of claim 15, further comprising providing a resistor network that connects at least one resistor to each of a plurality of electrodes of the conductivity sensor.

18. The method of claim 15, further comprising simulating a 25-degree-Celsius environment for the conductivity sensor being calibrated.

19. The method of claim 15, wherein applying a voltage across two electrodes of the conductivity sensor to replicate the properties of an electrochemical calibration solution comprises connecting a calibration device to a plurality of electrodes of the conductivity sensor, the calibration device including one or more resistors coupled to each of the plurality of electrodes.

20. The method of claim 15, wherein connecting a calibration device to a plurality of electrodes of the conductivity sensor comprises connecting a calibration device with a temperature calibration circuit for simulating a 25-degree-Celsius environment for the conductivity sensor being calibrated.

21. A method for calibrating a conductivity sensor, comprising the steps of:
a. applying a controlled voltage across two electrodes of the sensor;
b. sensing a current across the two electrodes while maintaining the sensor at a controlled temperature; and
c. calculating the conductivity of the sensor, based on whether the sensed current falls within a predetermined range indicating a pass of the sensor.

22. The method of claim 21, wherein applying a controlled voltage comprises applying a constant voltage from an external power source.

23. The method of claim 21, further comprising simulating a 25-degree-Celsius environment using a temperature calibration circuit.

24. The calibration device of claim 23, wherein using the temperature calibration circuit comprises coupling a switch component, configured to be triggered by a conductivity monitor, to a network of two or more resistors.

* * * * *